United States Patent [19]

Hoover et al.

[11] Patent Number: 4,560,445

[45] Date of Patent: Dec. 24, 1985

[54] CONTINUOUS PROCESS FOR FABRICATING METALLIC PATTERNS ON A THIN FILM SUBSTRATE

[75] Inventors: Merwin F. Hoover, Topsfield, Mass.; Phillip B. Reilly, Mountain Lakes, N.J.; Ann B. Salamone, Marblehead; Jan Vandebult, Topsfield, both of Mass.

[73] Assignee: Polyonics Corporation, Newbury Port, Mass.

[21] Appl. No.: 685,345

[22] Filed: Dec. 24, 1984

[51] Int. Cl.$^4$ .......................... C25D 5/02; C25D 5/56
[52] U.S. Cl. ........................................ 204/15; 204/20; 204/30
[58] Field of Search ................... 204/15, 20, 30, 38.4, 204/28; 427/97, 98

[56] References Cited

U.S. PATENT DOCUMENTS

| | | | |
|---|---|---|---|
| 3,167,490 | 1/1965 | Friedman | 204/15 |
| 3,208,921 | 9/1965 | Hill | 204/15 |
| 3,956,077 | 5/1976 | Hamby, Jr. | 204/15 |
| 4,082,618 | 4/1978 | Furuya | 204/28 |

Primary Examiner—T. M. Tufariello
Attorney, Agent, or Firm—Paul J. Cook

[57] ABSTRACT

A process is provided for fabricating metallic patterns such as resonant RF-tuned circuits on a polyolefin film such as polyethylene or polypropylene film. The film is processed under conditions such as to maintain its mechanical integrity by being passed through a solvent plasticizing bath, an etch bath to provide attraction sites and adhesion for catalytic metal deposition, a conditioning bath to improve catalyst adhesion and a catalyst bath to deposit a catalytic metal for electroless metal deposition. A negative image is printed on the film and an electroless metal deposit followed by an electrolytic metal plate are applied to the film to produce the desired metallic patterns. Optionally, prior to the printing step, an electroless metal deposit, with or without a thin electrolytic metal plate, can be applied to the total film surface. Thereafter, a negative or positive printed image is coated on the film. When these optional steps are utilized, the electroless metal deposit, thin electrolytic metal plate and printed image are selectively removed to leave the thick electrolytic metal plate on the electroless metal deposit in the form of the desired pattern.

26 Claims, 9 Drawing Figures

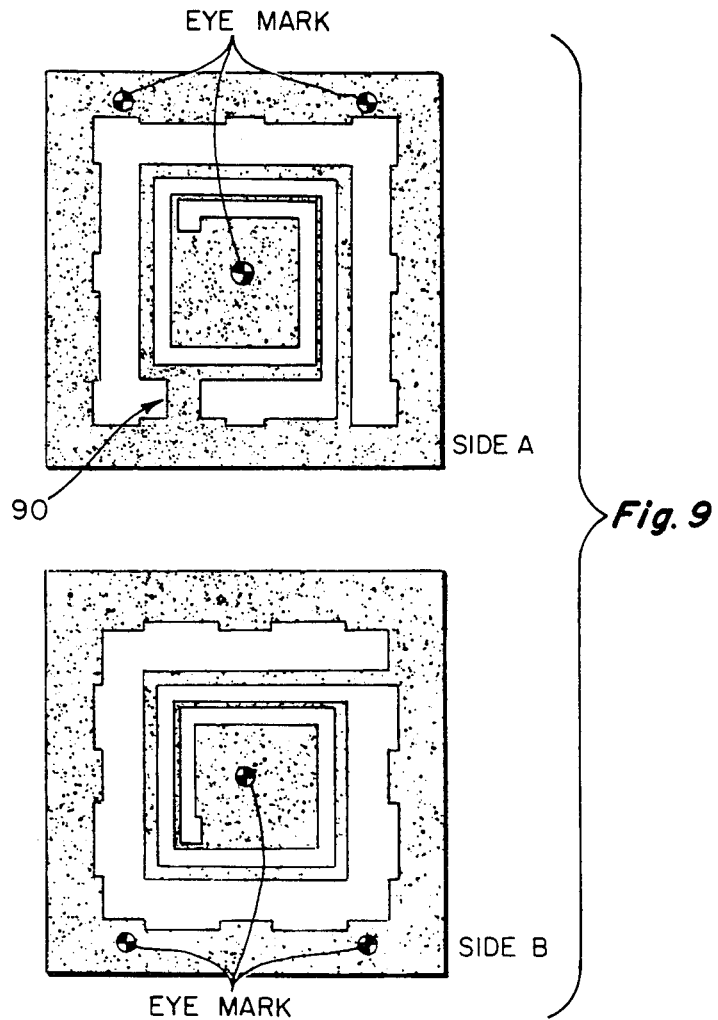

CONTINUOUS PROCESS FOR FABRICATING METALLIC PATTERNS ON A THIN FILM SUBSTRATE

BACKGROUND OF THE INVENTION

This invention relates to a process for forming electrically conductive metallic patterns on a thin polyolefin film substrate. More particularly, this invention relates to the formation of resonant RF-tuned printed circuits formed on a thin polyolefin film which are particularly useful in electronic security and article surveillance detection systems.

Presently, electronic security systems are utilized to detect unauthorized removal of articles from a protected area. These systems utilize radio waves, microwaves or a magnetic field generated within a confined area through which all articles from a shopping area must pass. A special tag is attached to the article which is sensed by a receiving system to signify the unauthorized removal of the article. When the sensing system does not sense the presence of the special tag within the confined area, then the removal of the article is authorized by virtue of its being paid for and the tag has been either removed from the article at the checkout counter or has been deactivated at the checkout counter.

A preferred special electronic tag utilizes a technology based on tuned circuits which operate in the radio frequency range. To render the tuned circuit functional at the desired frequency, a discrete inductor (L) and a discrete capacitor (C) are connected together. The reusable resonant tag uses discrete capacitor and inductor components which are connected to form the tuned inductor-capacitor (LC) circuit. Prior to the present invention, the capacitor and inductor have been formed by conventional fabrication methods for forming printed circuits including selective use of laminated substrates having an interior dielectric layer laminated on both surfaces with a conductive composition such as aluminum or copper. The conductive layers are printed with an etchant resistant material in the form of the desired circuit and, after etching, the remaining conductive material is now in the form of the desired circuit. Such a conventional process is disclosed, for example, in U.S. Pat. Nos. 3,913,219 and 4,369,557. Further examples of resonant circuit tags are disclosed in U.S. Pat. Nos. 3,967,161; 4,021,705; 3,810,147 and 3,863,244. Any process for producing disposable resonant tag circuits must be capable of producing satisfactorily functioning resonant tag circuits at high volume and low cost with accurate tolerances so that uniform electrical properties are obtained from tag to tag. In resonant tag circuits, it is desirable to produce tags that operate at specific frequencies. Specific frequencies can be obtained by varying L and/or C based on the equation:

$$f = \frac{1}{2\pi \sqrt{LC}} \qquad \text{Equation 1}$$

In general, it is also desirable to have a sharp resonance curve where there is a large change in impedance over a narrow frequency range in order to provide the desired selectivity to discriminate between tuned circuits and environmental interferences.

The sharpness of the resonance curve is usually described by a quality factor called "Q" which can be defined as the ratio of the reactance of either the coil or the capacitor at resonant frequency to the total resistance. It is also a measure of the reactive power stored in the tuned circuit to the actual power dissipated in the resistance of the circuit. The higher the "Q", the greater the amount of energy stored in the circuit compared with the energy lost in the resistance during each cycle. A circuit with a higher "Q" has greater sensitivity in responding to the detector field due to less energy loss within the circuit. Therefore, it is generally desirable to have a resonant tag circuit with a high "Q" factor.

Mathematically:

$$Q = \frac{X_L}{R} = \frac{2\pi f L}{R} \text{ or} \qquad \text{Equation 2}$$

$$Q = \frac{X_C}{R} = \frac{1}{2\pi f CR} \qquad \text{Equation 3}$$

Where
$X_L$ = Inductive reactance
$X_C$ = Capacitive reactance
L = Inductance
C = Capacitance
f = Frequency
R = Resistance Combining equations 2 and 3:

$$Q = \frac{1}{R} \sqrt{\frac{L}{C}} \qquad \text{Equation 4}$$

which indicates "Q" can be improved by:
(a) Lowering the resistance (R)
(b) Increasing the inductance (L)
(c) Reducing the capacitance (C)

The "Q" factor is also related to the nature of the dielectric film in the resonant tag circuit which means, the dielectric loss of the substrate should be minimized to improve the "Q" factor. This dielectric loss is normally referred to as the dielectric dissipation factor of the capacitor. Many polymeric films such as polyimide film or polyester film cannot be utilized to form resonant tag circuits since their dielectric properties are inappropriate at the desired frequencies.

Federal Communication Commission requirements dictate that the frequency and power level of the swept electromagnetic waves be held within fairly close tolerances, which in turn, requires that the resonant tag circuits have a relatively high "Q" factor and the resonant frequencies fall within a narrow range in order to assure that they will be reliably detected by the system.

With the prior art techniques such as those disclosed in U.S. Pat. Nos. 3,913,219 and 4,369,557 which use printed circuit etching techniques combined with printing of an etch-resistant pattern on opposite surfaces of a metal foil laminated onto an insulative material, it is difficult to mass-produce resonant circuits in relatively high quantities within the desired resonant frequency tolerances of 10% (±5% of the center of resonant frequency desired), due to variations of the printing and etching rates.

In processes utilizing a step wherein a metal coating of relatively uniform thickness is etched to remove it from a substrate, control of the process is difficult, particularly when the desired circuit includes thin conductive lines. With such circuits, it is essential that etching compositions, metal thicknesses, etching times and other process parameters be uniformly and precisely controlled in order to maintain the integrity of the desired circuit. This problem of maintaining precise control of the process parameters is not nearly so critical in additive processes, since in additive processes one must attain a certain minimum metal deposition (thickness) and further metal deposition beyond the minimum does not adversely affect the quality of the circuit thus produced. The requirement for precise process control in the subtractive etching type processes serves to limit the volume production of circuits since process downtime frequently occurs when the process parameters are found to be outside of the critical process parameters necessary for producing satisfactory products. The use of a subtractive etching type process is also undesirable since the metal removed from the laminated substrate is lost and the cost of the process is thereby increased. This is particularly true when it is desirable to use highly conductive and expensive metals such as copper, silver or gold. As a practical matter, the subtractive etching process is only commercially feasible when using less conductive, inexpensive metals such as aluminum to form the laminated substrate from which the circuits are produced.

It is also known in the prior art to produce metal coatings on plastic parts such as molded plastics used for automotive parts (e.g., knobs, trim, etc.) which involves the steps of treating a plastic substrate so that it is capable of accepting a catalyst compound that promotes electroless metal deposition. The thus-activated plastic substrate then is immersed in an electroless metal bath to form a conductive, metal coating on the substrate. Additional metal coatings can be formed on the electroless metal surface by electroplating if desired. In these processes, the plastic substrates have a large mass and are relatively thick and therefore are capable of withstanding severe process conditions such as exposure to strong solvents and etching acids at elevated temperatures to condition the surface so that catalyst compounds can be deposited on the plastic surface relatively quickly.

It is also known to form printed circuits by using a variety of masking and plating techniques as disclosed for example in U.S. Pat. Nos. 4,293,592; 4,322,457 and 4,354,911.

Prior to the present invention, it has been known to form printed circuits on relatively thin and flexible polyester or polyimide substrates as disclosed for example in U.S. Pat. No. 4,261,800. The resultant products are useful as flexible circuits where highly efficient utilization of space is essential. However, the technology used to form printed circuits on these substrates is not generally useful for forming printed circuits on polyolefin substrates since the surface chemistry of polyolefins is far less reactive as compared with polyesters or polyimides. Furthermore present technology for producing printed circuits is not applicable to thin polyolefin films since the film has far less mechanical strength and resistivity to chemical baths and solvents. Thus, at the present time, there has not been available a totally satisfactory process for forming electrically conductive circuits on thin film polyolefin substrates by additive plating technology. Thin film plastic substrates are difficult to utilize in an additive process for producing a printed circuit thereon. This is due primarily to the requirement of catalyzing the surface of the thin plastic film so that subsequent electroless deposition of metal can be achieved which is adherent and has sufficient adhesion that it will not flake off under flexing conditions. The conventional means for implanting a catalyst composition on the surface of the plastic substrate utilizes severe process conditions. In the case of thin film plastic substrates, the mechanical integrity of the film would be destroyed utilizing conventional process parameters. For example, hot solvents such as chlorinated hydrocarbons, dimethylformamide or cyclic ethers would destroy the mechanical integrity of most thin film plastic substrates.

These problems with thin films are compounded when it is desired to process the thin film continuously in a roll-to-roll process; that is, in a process wherein an untreated thin film is unwound from a feeder roll, passed through the treatment baths and wound up on a take-up roll. During the individual processing steps, the thin film may expand or contract depending upon the nature of the liquid medium, which maybe at variable temperatures, through which it is passed. In any event, it is extremely difficult to effect the desired surface treatment of the thin film strip in order to affix thereon a circuit of the desired design, particularly when a portion of the circuit is affixed to opposing surfaces of the thin film and when the circuit portions on the opposing surfaces must be in proper alignment so that the desired overall circuit functions can be attained. The surface treatment must be sufficiently effective to modify the surface to effect printing but must be relatively mild so that the mechanical integrity of the film is maintained and the desired circuit pattern can be formed thereon. These process requirements are necessary for each film treatment stage.

It has been proposed in U.S. Pat. No. 4,006,047 to utilize a class of organic palladium moiety complexes to deposit palladium catalyst on a thin film substrate in order to catalyze subsequent electroless metal deposition and to avoid excessively high temperatures which damage the thin film while activating the catalyst. This patent discloses a technique for plating on polyolefin film which utilizes highly flammable solvents and moisture sensitive organo-palladium complexes. Furthermore, the palladium complexes are easily oxidized and thus rendered useless as a catalyst for electroless metal deposition unless plated immediately. Therefore, this process does not allow for printing a circuit image mask on the film prior to electroless metal deposition.

Accordingly, it would be desirable to provide a means for utilizing an additive process for forming printed circuits on a thin film polyolefin substrate under conditions which retain the catalytic activity and mechanical integrity of the polyolefin film. Furthermore, it would be desirable to provide such a process, which is capable of producing printed circuits within the close tolerances normally required at high volumes in a roll-to-roll process, in order to provide commercial incentive for utilizing the process. Furthermore, it would be desirable to provide such a process which eliminates the need for etching relatively thick layers of metal from the metal-plastic laminates now employed to produce circuits.

SUMMARY OF THE INVENTION

The present invention provides an additive process for forming metallic patterns on a thin polyolefin film substrate. In the process, the film is treated in order to deposit thereon a catalyst composition which promotes electroless deposition of metal onto one or both surfaces of the thin film polyolefin substrate with good adhesion. The polyolefin film is contacted with a solvent under mild conditions to plasticize the film and render it receptive to etching with an acidic etchant. The catalyst composition then is adsorbed onto the surface of the etched film. The etched film containing the catalyst composition then is printed with a negative image of the circuit pattern and electrolessly and electrolytically plated in the non-printed areas. This is referred to as the additive process (see Scheme I in Chart I). In the additive process, the printing step precedes the electroless and electrolytic plating. However, in the semi-additive process (see Scheme II in Chart I), electroless plating with or without a subsequent thin electrolytic plate precedes printing, and the printed negative image of the circuit pattern, which masks the plated layers, is subsequently removed by stripping and the previously masked plated areas are removed by etching. Even when utilizing an etching step to remove electrolessly deposited copper, the process of this invention provides advantages over the processes of the prior art since the electrolessly deposited copper is a far thinner film as compared to the metal layer in the metal-plastic laminates now utilized. Furthermore, electrolessly deposited copper can be removed by etching under far milder conditions than is necessary when utilizing the metal-plastic laminates now used to form printed circuits. Scheme III of Chart I represents another semi-additive technique that is possible, but it does not provide any economical or technical benefits over Scheme I or II, which are preferred. It has been found that the process of this invention permits forming printed circuits on rolls on thin polyolefin substrates at high speeds continuously so as to produce printed circuits within commercially desirable tolerances.

CHART I

| Additive Process | Semi-Additive Processes | |
| --- | --- | --- |
| Scheme I | Scheme II | Scheme III |
| 1 Plasticize (soften) | 1 Plasticize (soften) | 1 Plasticize (soften) |
| 2 Etch | 2 Etch | 2 Etch |
| 3 Condition | 3 Condition | 3 Condition |
| 4 Catalyze | 4 Catalyze | 4 Catalyze |
| 5 Print Negative | 5 Accelerate | 5 Accelerate |
| 6 Accelerate | 6 Electrolessly Plate | 6 Electrolessly plate |
| 7 Electrolessly Plate | 7 *Partial Electrolytic Plate | 7 *Partial Electrolytic Plate |
| 8 Electrolytic Plate | 8 Print Negative | 8 Print Positive |
| | 9 Electrolytic plate | 9 Back etch |
| | 10 Strip Ink | 10 Strip Ink |
| | 11 Back etch | 11 Electrolytic Plate |

*Optional

BRIEF DESCRIPTION OF THE DRAWINGS

FIG. 9 shows the two circuit paths on opposing surfaces of an insulating layer containing a fused link produced in Example IV.

DESCRIPTION OF SPECIFIC EMBODIMENTS

Figure 1:
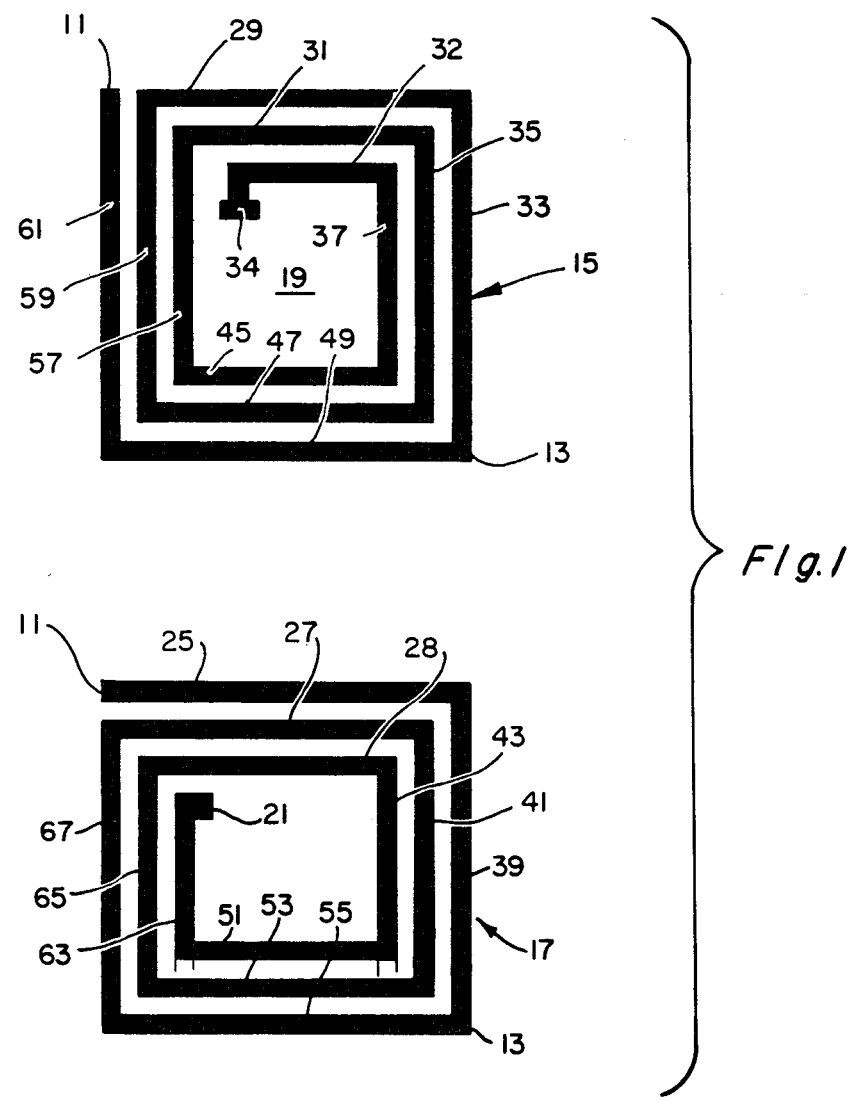
FIG. 1 shows two circuit paths on opposing surfaces of an insulating layer produced by the process of this invention.

In accordance with this invention, a thin film polyolefin substrate is treated to effect adsorption of a catalyst composition on one or both surfaces of the film without materially adversely affecting the mechanical strength of the film. The term "polyolefin film substrate" refers to a film formed from a polymer composition having a thickness usually between about 0.02 and about 0.0001 inches. Suitable polyolefin films include polyethylene, polypropylene, polybutylene, polypentene, and copolymers or mixtures thereof. The pretreatment process generally involves the use of the following succession of treatment steps: (a) solvent swelling, (b) etching, (c) conditioning, and (d) catalyzing. Solvent swelling is conducted to plasticize the polyolefin film thereby to facilitate etching which provides a microporous surface, but without permanently adversely affecting the mechanical properties of the film. That is, the film should retain virtually all of its mechanical strength upon removal of the plasticizer therefrom. The degree of plasticizing should be controlled so that the film can be etched subsequently without adversely affecting its mechanical properties. The particular solvent composition employed depends upon the particular polyolefin film being treated. For example, with polypropylene, turpentine based emulsions are desirable and such solvent systems are disclosed in U.S. Pat. No. 3,579,365. Usually the film is immersed for a time between 1 and 10 minutes. The solvent-treated film then is rinsed prior to etching to remove excess solvent. The polyolefin thin film then is etched to provide attraction sites for subsequent catalytic metal deposition and to provide microvoids for increasing adhesion of the metal-plating layer to be subsequently applied. Etching involves solvating one or more phases of the polyolefin surface to form microvoids and chemically modifying the remaining resin to provide attraction sites for catalytic metal deposition. It has been found that precise control of this step is essential in the process of this invention in order to render the surface sufficiently adherent to the subsequent metal layer without destroying film mechanical integrity. The micro-pitted film surface facilitates excellent adhesion on subsequently applied metal so that the circuits so formed do not peel or flake from the film. The conditions of etching must be controlled to maintain the mechanical integrity of the film while effecting sufficient surface modification to promote subsequent electroless metal deposition so that the plating is tightly adhered to the film without being delaminated. Secure bonds to the deposited metal are achieved by microroughening the substrate, such as by the use of controlled acidic chromium oxidation, prior to plating. When utilizing polyolefin film, particularly polyethylene or polypropylene film, the preferred etching composition is a mixture of chromic acid and sulfuric acid wherein the weight ratio of chromic acid to sulfuric acid is between about 1 to 2 and 1 to 5, the etching solution is between about 40° and 50° Baumé, preferably between about 41° and 48° Baumé. In addition, the etchant bath should be maintained between about 60° C. and 90° C., preferably between about 75° C. and 85° C. In addition, it has been found highly advantageous to use a fluorochemical surfactant additive in the chromic/sulfuric acid etching bath at concentrations between 10 and 1000 ppm, preferably 100–500 ppm, which increases film surface wetting by the etching solution and promotes a more even etching profile across the film surfaces. Such fluorochemical surfactants are described in U.S. Pat. No. 3,515,649. A typical preferred etching bath is made by dissolving chromic acid ($CrO_3$) in water and then adding concentrated (96–98%) sulfuric acid so that the composition is 15% by weight $CrO_3$ and 50% by weight $H_2SO_4$ and 35% water with 0.01% Macuplex I-57, a fluorochemical surfactant, (available from MacDermid Incorporated, Waterbury, Conn.) added. Surprisingly, it has been found that when utilizing these etching conditions, it is possible to obtain excellent electroless metal adhesion by forming microvoids in the film surface while retaining film mechanical integrity.

Following etching, a thorough rinse is generally given to the treated film followed by conditioning which includes neutralization of the film surface, chelation of contaminating metals, and treatment with surfactants or salt mixtures which aid in the subsequent adsorption of catalytic materials which initiate electroless metal deposition in the subsequent metal plating step (see for example U.S. Pat. No. 3,563,784). Typical surfactants that can be used are ethoxylated phenols and suitable chelators include ethylenediaminetetraacetic acid or other related derivatives. Subsequent to conditioning and rinsing, the film is catalyzed by absorption of catalytic metal into and on one or both surfaces of the film substrate. Palladium-tin combination baths are used for plating on many plastics, including polyolefins, as described in U.S. Pat. Nos. 3,532,518, 3,515,649, and 3,011,920. In the case of using a palladium catalyst, it is necessary to utilize it in combination with tin in order to prevent palladium oxidation, promote its adherence to the film, and to prevent active palladium particle aggregation. When the catalyst is activated, the tin is removed and exposure of the palladium particles to the electroless metal bath is enhanced thereby. Non-noble metal catalyst systems using nickel and copper, or copper or nickel alone, also can be employed as described in U.S. Pat. No. 4,234,628. The requirement for this catalytic metal is that it permits and aids in the deposition of a metal onto the film by electroless (or catalytic) plating. When depositing a palladium-tin catalyst, deposition is effected at a temperature between about 15° C. and 30° C. from a liquid vehicle such as water usually comprising aqueous inorganic acids, such as hydrochloric acid, and with a film immersion time between about 1 minute and 10 minutes. When depositing nickel and/or copper catalysts, deposition is effected at a temperature between about 15° C. and 30° C., from a liquid vehicle usually comprising an aqueous solution of the metal salts with a film immersion time between about 1 minute and 10 minutes.

When printing a negative image of the desired printed circuit, this step is effected prior to electroless plating as in the totally additive process. The negative mask is printed in the non-circuit areas of the pretreated and catalyzed plastic film so as to mask out those areas where plating is not desired. The mask can be printed by any conventional means such as by screen printing, offset, rotogravure, flexography or the like. Chemically resistant inks can be employed which can be either solvent based, water borne or UV curable materials. Printing can be effected in a continuous, repetitive manner over the entire length of the film which has been pretreated as described above, thereby to produce a plurality of individual circuit tag patterns in a repeating fashion. To produce circuits, such as those described in U.S. Pat. Nos. 3,913,219 and 4,369,557 as well in copending U.S. patent application Ser. No. 565,350, filed Dec. 27, 1983, for Resonant Tag Circuits Useful in Electronic Security Systems, printing is required on both sides of the thin film substrate in a manner which provides very close alignment of the conductive circuit patterns to provide the desired degree of alignment and overlap which is critical in determining the desired electrical properties. Throughhole electrical connections may be incorporated by perforating or die punching prior to or during the printing steps. A preferred printing procedure involves the printing of an air dried flexographic ink onto the film on a continuous flexographic printing press. This ink must be chemically resistant to subsequent accelerator, alkaline electroless and acidic electrolytic plating baths and must adhere well to the film.

In a roll-to-roll process, such as disclosed in this invention, the film treated with the catalytic compound and either printed or unprinted prepared by the process described above, can be either stored, e.g. on a roll or can be passed immediately and continuously through the plating steps described below after acceleration. Thus the process of this invention provides flexibility in that the total process can be conducted in two or three different phases at different times or at different sites wherein the environment can be independently controlled if desired.

Once the catalytic metal has been deposited on the film, further treatment using a citric acid, fluoroboric acid or hydrochloric acid wash for Pd/Sn catalysts, or reaction using sodium borohydride, amine boranes, hydrazines or aldehydes for Cu/Ni catalysts may be required. This posttreatment, called acceleration, is necessary to reduce the catalytic metal to the zero valence state or remove colloid protectors such as tin oxide, and hence render it catalytically active toward electroless plating. Thorough rinsing is conducted after the catalyzing and accelerating baths to ensure the removal of excess, loose catalytic metal either on the film substrate or printed coating. Excess, loose catalytic metal lying on the film substrate can cause lack of electroless metal adhesion. In addition, loose catalytic metal can be carried forward into the subsequent electroless metal plating bath and cause poisoning.

Most commercial electroless metal plating baths are suitable for the process of this invention; that is, a process which catalytically reduces metal out of a solution of metallic salt where there are no outside sources of electrical current. The necessary electrons in the solution are produced by a chemical process rather than supplied externally. Representative metals that can be applied in this manner are copper, nickel, gold, silver, tin, lead, palladium, and platinum. Copper is preferred because it is conductive, ductile and relatively inexpensive. The metal to be plated can be varied, however, depending on the desired conductivity or resistivity. In the same circuit pattern, for instance, it may be desired to incorporate selected areas of resistance by plating with silver/palladium or other metals of various thicknesses and widths in addition to plating selected areas for conduction with copper or nickel. The primary requirements for the printed circuits are adhesion to the film substrate, flexibility that matches the substrate, conductivity, abrasion resistance and resistance to humidity and temperature changes. The electrolessly deposited metal is in the pattern of the desired circuit.

Copper is the preferred electroless metal plating composition. The state of the art in electroless copper plating compositions and processes are reflected in the following patents: U.S. Pat. Nos. 2,874,072; 2,996,408; 3,033,703; 3,075,855; 3,075,856; 3,095,309; 3,146,125; 3,222,195; 3,259,559; 3,269,861; 3,307,972; 3,326,700; 3,383,224; 2,403,035; 3,453,123; 3,457,089; 3,492,135; 3,607,317; 3,615,732; 3,615,736; 3,649,350; 3,663,242; 3,664,852; 4,124,399.

A typical electroless copper plating solution is disclosed in U.S. Pat. No. 3,475,186 and has the following composition:

| | |
|---|---|
| Copper sulfate.5H$_2$O | 10 g/L |
| Sodium hydroxide | 10 g/L |
| Formalin (37%) | 20 ml/L |
| EDTA (tetrasodium salt of ethylene diaminetetraacetic acid) | 20 g/L |
| Methyldichlorosilane | 0.25 g/L |

The above patents are incorporated herein by reference.

In the adaptation of electroless copper plating formulations to specific applications, such as the catalyzed polyolefin film being plated in this invention, the role of stabilizers is of great significance and a wide variety of stabilizers, generally present in small concentrations, have been reported. Typical stabilizers reported applicable to electroless copper formulations include mercaptobenzothiazole, thiourea, cyanide, vanadium oxide, methyl butynol, mercury, selenium compounds and the like.

Subsequent to the initial electroless deposition of metal, additional layers of metal can be electrolessly or electrolytically deposited on the first electrolessly deposited metal. The thin film printed substrate with electrolessly deposited metal is passed through an electroless or electrolytic bath of the same or a different metal depending upon the end use requirements. Representative suitable additional metal layers can comprise copper, nickel, silver, gold, tin, tin-lead or the like, preferably copper or nickel. The electroless and electrolytic metal plating may employ any technique known in the art such as baths or brush plating.

Compositions of electroplating baths vary considerably, depending on the articles being plated, current density requirements or limitations and physical properties desired. Two general types have been found most useful for the electroplating requirements of this invention.

(1) a high copper, low acid, electroforming type bath which has a typical composition of 22 oz/gal of CuSO.5H$_2$O and 14 oz/gal H$_2$SO$_4$ in deionized water, and (2) a low copper, high acid, electrolytic bright bath, which has a typical composition of 10 oz/gal CuSO$_4$.5H$_2$O, 25 oz/gal H$_2$SO$_4$ and 0.8% by volume of a proprietary brightener additive such as M&T's Copperlume PTH-R or Electrochemical's PC-606. Each bath also contains 50–70 ppm chloride ion (Cl$^-$) to aid in anode corrosion.

As a final step, the printed circuit can be laminated such as with an adhesive backed paper or a plastic protective coating to protect the circuit and to allow positioning the circuit on other articles.

In an alterative embodiment, the semi-additive process shown in Scheme II of Chart I, the pretreated film is subjected to electroless deposition of metal which may be followed by electrolytic deposition to form a thin metal coating having a thickness generally between about 10 microinches and about 200 microinches. These coatings are generally less than about 15% as thick as the metal coating portion of the prior art laminate starting material utilized in the subtractive etching process described above. This thin metal coating can be easily removed (etched) under mild conditions which do not adversely affect the printed circuit design or adversely affect the mechanical properties of the film substrate. A polymeric coating then is printed onto the metal coating either in the form of the negative image of the desired circuit or the positive image of the desired circuit. In the case of printing the positive image of the desired circuit, shown in Scheme III of Chart I, the composition utilized to print the positive circuit pattern must be resistant to subsequent copper stripping solutions such as ammonium persulfate, hydrogen peroxide, ferric chloride, hydrochloric acid, cupric chloride or the like. The printed film is then passed through a metal stripping (etching) solution to quickly remove the very thin metal layer in the non-printed or background areas of the circuit pattern, thus rendering those areas non-conductive and not receptive to subsequent electrolytic plating. The film then is passed through an appropriate solvent bath which easily removes the protective printing ink without causing mechanical degradation to the film, thus exposing the copper deposited in the form of the desired circuit pattern on one or both sides of the film. The film also may incorporate a through-hole connection provided by a repetitive spot melt or slit device in the case of printing a circuit pattern on both sides of a film. The roll of film containing a plurality of circuit patterns then is electrolytically plated in a continuous plating fashion to increase the metal thickness and thereby to provide the required low resistance for the printed circuit desired.

In the case of printing the negative image of the desired circuit subsequent to an initial deposition of thin metal (Scheme II of Chart I), the exposed metal then is electrolytically plated in the manner described above. This negative image must be printed with a polymeric coating (ink) which is chemically resistant to the acidic electroplating baths. The electrolytically plated film then is passed through an appropriate stripping solvent which removes the masking ink from the non-image areas exposing the thin metal film. This thin metal layer then is easily removed in a subsequent metal stripping or etching bath. Since the electrolytic metal layer is far thicker than the initial thin metal deposit, selective removal of the exposed thin metal deposit can be easily achieved. The printed circuit thus formed then can be laminated with a protective layer and/or an adhesive in the manner described above. The laminated polyolefin film substrate can be further processed such as being fed to a rotary die cutter which cuts out waste materials not part of the circuit and/or cuts the web into individual operative circuits of the desired size suitable for installation as desired such as with dispensing equipment commonly used in the labeling or marking industry for retail stores. A roll of printed and plated tags can be slit into narrower rolls, either one or more tags wide, to permit processing in the usual manner in commercially available label dispensing equipment.

Throughout the processing of the film in a roll-to-roll process, the film is passed over driven rollers thereby to advance the film sequentially through the process steps. The driven rollers are controlled to prevent permanent stretching of the film when it is immersed in a heated bath or when the film is solvent softened.

The process of this invention is particularly useful in forming resonant tag circuits wherein a portion of the circuit is formed on opposing surfaces of a polyolefin film and wherein the circuit portions are aligned with respect to each other to form an inductor and to cooperate with each other to effect distributed capacitance.

As used herein, the term "spiral conductive path" or "spiral path" means a continuous conductive path that turns through greater than 360 degrees.

As used herein, the term "discrete capacitance" or "discrete capacitor" means a capacitor element formed from two conductive pads, each located on one surface of polyolefin film and which conductive pads overlap each other over a sufficiently great area as to function primarily as a capacitor which has little inductance. The relative contribution of capacitance or inductance can be estimated as a first approximation by measuring the overlap area for a specific element and the overlap areas of the total circuit as compared to measuring the total length of a specific element in the direction of the spiral path(s) and the total length of the inductor coil(s) in the resonant tag circuit(s). When the ratio defined by Formula 1 is greater than 10, the circuit element is a discrete capacitor as that term is used herein:

$$\text{Ratio} = \frac{\frac{A}{A_T}}{\frac{L}{L_T}} \qquad \text{Formula 1}$$

wherein A equals the area of overlap for a conductive element that contributes to capacitance and inductance, $A_T$ equals the total capacitor area of the resonant circuit(s), L equals the total length of the conductive element in the direction of the spiral path(s) that contributes to capacitance and inductance, and $L_T$ equals the total inductor length in the direction of the spiral of the resonant circuit. The factors of Formula 1 can be directly measured.

As used herein, the "distributed capacitor" or "distributed capacitance" means a circuit element which functions both as a capacitor and as an inductor. The distributed capacitor is formed from two overlapping spiral conductive paths, one each on a surface of an electrically insulating layer. The relative contribution of capacitance to inductance is approximated by Formula 1. A distributed capacitor in accordance with this invention has a ratio (according to Formula 1) of 10 or less. In accordance with the process of this invention, the distributed capacitor portion of the circuit provides at least 70% of the area of overlap between the two opposing spiral conductive paths, preferably at least 90% of such overlap and most preferably at least 100% of such overlap.

In accordance with the process of this invention, a resonant circuit is formed by inductor coil circuit paths affixed to the opposing surfaces of a thin dielectric polymeric substrate. Each inductor coil is formed of a spiral such as a square or rectangular spiral, circular spiral, triangular spiral or the like wherein a portion of the spiral overlaps with a corresponding portion of the spiral on the opposite surface wherein the degree of overlap is controlled to form a distributed capacitor comprising the overlapping portions of the spiral and the interposed dielectric material between the two overlapping portions of the spiral. The remaining portions of the spiral can be offset from each other so that their function as inductor coils does not contribute to capacitance. One end of the spiral inductor coil may be electrically connected to the corresponding end of the spiral inductor coil on the opposing surface of the dielectric material. Using the distributed capacitance, it is possible to eliminate the need for any through-hole connection provided the amount of distributed capacitance and inductance is sufficient to tune the circuit to the desired frequency.

In one embodiment of this invention, a fusable link can be introduced into either one or both of the inductor coil circuit paths at any section of the spiral coil. This fusable link can be destroyed with electromagnetic energy at a specific frequency to deactivate the tuned circuit. The distributed capacitor portion of each inductor coil can comprise the outer portion of the spiral path, the inner portion of the spiral path and/or an intermediate portion of the spiral path.

The process of this invention also can be utilized to form circuits wherein the inductor coil circuit paths are tapered, the outside spiral path being the widest and tapering down towards the inner spiral path to equalize current density during the electroplating of the circuit to give a more uniform metal thickness throughout the length of the circuit trace. In another embodiment of this invention, the inductor coil circuit paths are tapered to minimize the amount of conductive material located near the center of the circuit to improve the antenna effect of the tuned circuit. In still another embodiment of this invention, the inductor coil paths are tapered to increase the number of possible coil winds that can be added, thus increasing the inductance, reducing the frequency and/or increasing the "Q" factor.

It is not necessary that the circuit paths on both surfaces of the insulating layer be identical. For example, the circuit path or coil on one surface of the insulating layer can be wider than the circuit path or coil on the opposite surface so that the desired overlap of circuit paths is achieved even though there is minor misalignment of the circuit paths during manufacture. This embodiment provides latitude during manufacture which minimizes the production of malfunctioning tag circuits. It is desirable that the total plated area on each surface be approximately equal to the other surfaces.

Referring to FIG. 1, a resonant circuit which has a center frequency of 8.1 MHz is shown. This circuit is formed by overlapping points 11 and points 13 to each other on opposing surfaces of an insulating layer. Conductive path 15 is provided on one surface and conductive path 17 is provided on the opposing surface. A conductive path extends through the insulating layer 19 and is connected to points 21 and 34 on opposing surfaces of the insulating layer 19 so that the conductive paths 15 and 17 are connected thereby. The conductive paths 15 and 17 overlap each other on winding sections 25, 27 and 28 which overlap winding sections 29, 31 and 32. Winding sections 33, 35 and 37 overlap winding sections 39, 41 and 43, respectively. Winding sections 45, 47 and 49 overlap winding sections 51, 53 and 55, respectively, while winding sections 57, 59 and 61 overlap winding sections 63, 65 and 67, respectively. Utilizing this design, a discrete capacitor can be eliminated and the conductive paths 15 and 17 cooperate together to provide both the inductor function and the distributed capacitor function. On one side of the circuit, the inductor line is only about 18 inches and the line width varies from between about 0.08 inches and 0.06 inches. Thus, by utilizing this design, the discrete capacitor can be eliminated and the size of the overall tag can be made much smaller than that which can be made by the prior art designs.

Utilizing the distributed capacitance design shown in FIG. 1 to manufacture a resonant circuit provides many significant advantages. Utilizing the present state of the art etching process, the manufacturing time and cost is greatly reduced as compared to prior art resonant circuit designs having a discrete capacitor because the circuit lines in the design of this invention can be made wider, thereby allowing thinner conductive paths to be utilized. Resistance is a function of cross-sectional area; therefore, wider lines allow the use of less thickness of metal to attain a given resistance value. By utilizing wider lines which are less thick, the plating cost is reduced and the possibility of breaks or short circuits also is reduced. Furthermore, when utilizing an additive or semi-additive manufacturing approach as described in this invention, the use of the distributed capacitance concept allows the use of wider lines of decreased thickness per side of insulating material. In addition, a balanced two-sided design with equal plated areas on each side can be utilized in the present invention. For example, when utilizing the pattern shown in FIG. 1, the plating time can be reduced to less than about 30 minutes.

Figure 2:
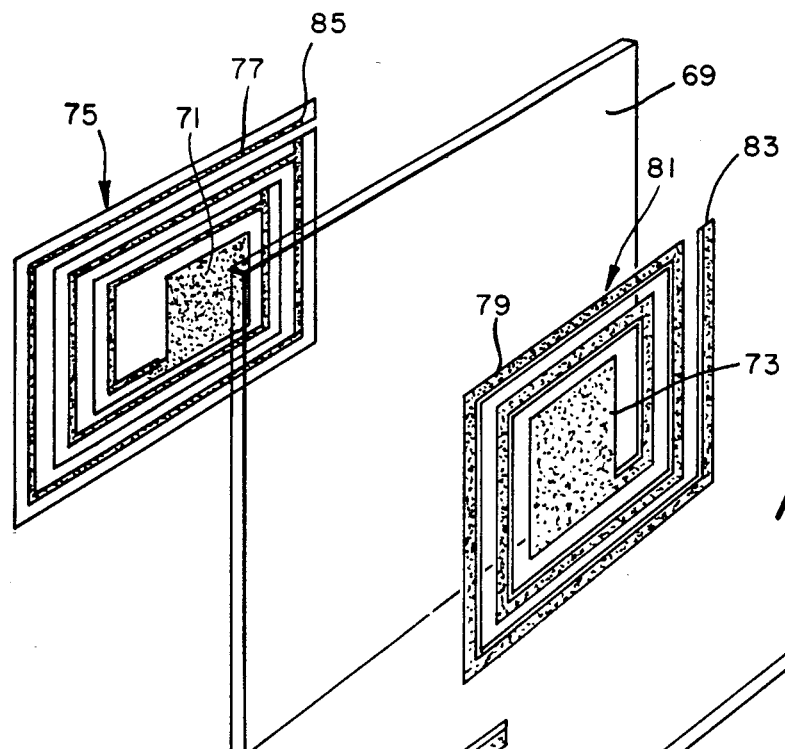
FIG. 2 shows a resonant circuit having both distributed capacitance and discrete capacitance in accordance with the process of this invention.

Referring to FIG. 2, a resonant circuit is shown which includes both distributed capacitance and discrete capacitance wherein the discrete capacitance comprises less than about 30% of the total capacitance of the entire circuit. This contrasts with prior art circuit designs wherein the capacitance is provided essentially entirely by discrete capacitance. As shown in FIG. 2, the discrete capacitor is formed from conductive area 71 and conductive area 73 located on opposing surfaces of insulating layer 69. Conductive path 75 is formed from a rectangular spiral as shown in FIG. 2 wherein a portion of the conductive path shown in darkened area 77 overlaps with the darkened portion 79 of conductive path 81. The overlapping portions of conductive paths 75 and 81 function as a distributed capacitor as well as the inductor. Conductive paths 75 and 81 can be joined through or around the substrate 69 by means of electrical connections 83 and 85 or around the substrate at any point along the outer circumference of the coil formed from conductive paths 75 and 81.

Figure 3:
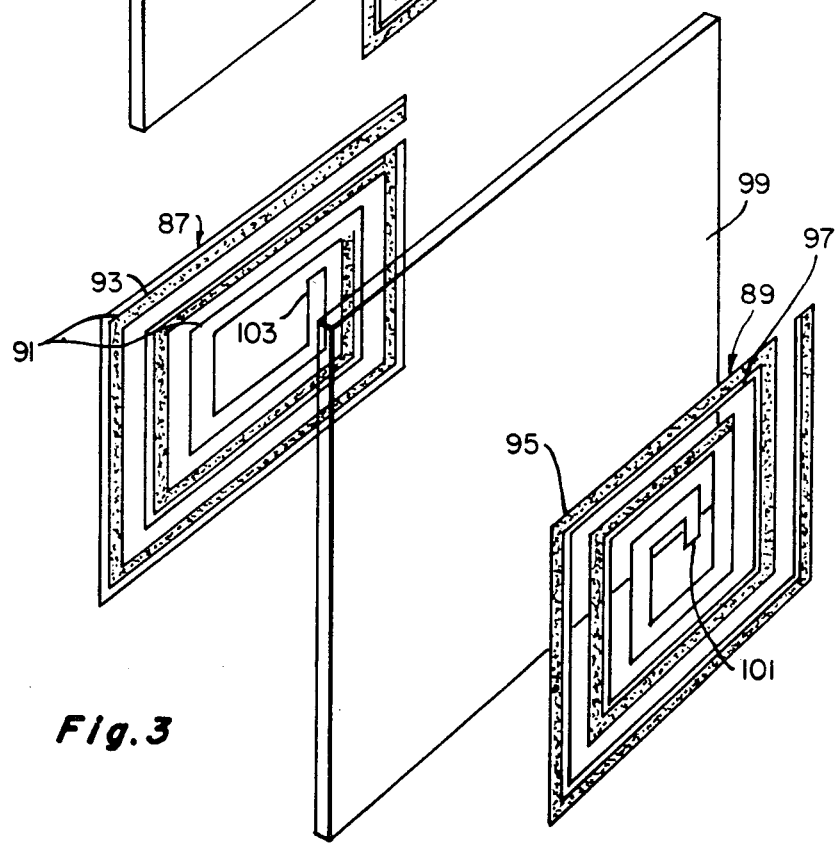
FIG. 3 shows a circuit with two opposing spiral conductive paths wherein there is only partial overlap for distributed capacitance produced by the process of this invention.

Referring to FIG. 3, a resonant circuit is shown wherein there is partial overlap of two separate conductive paths 87 and 89. The light portion 91 of spiral 87 does not overlap with spiral 89 while the dark portion 93 of spiral 87 overlaps with the dark portion 95 of spiral 89. Similarly, the light portion 97 of spiral 89 does not overlap with spiral 87. Spirals 87 and 89 can be connected through insulated substrate 99 at points 101 and 103.

Figure 4:
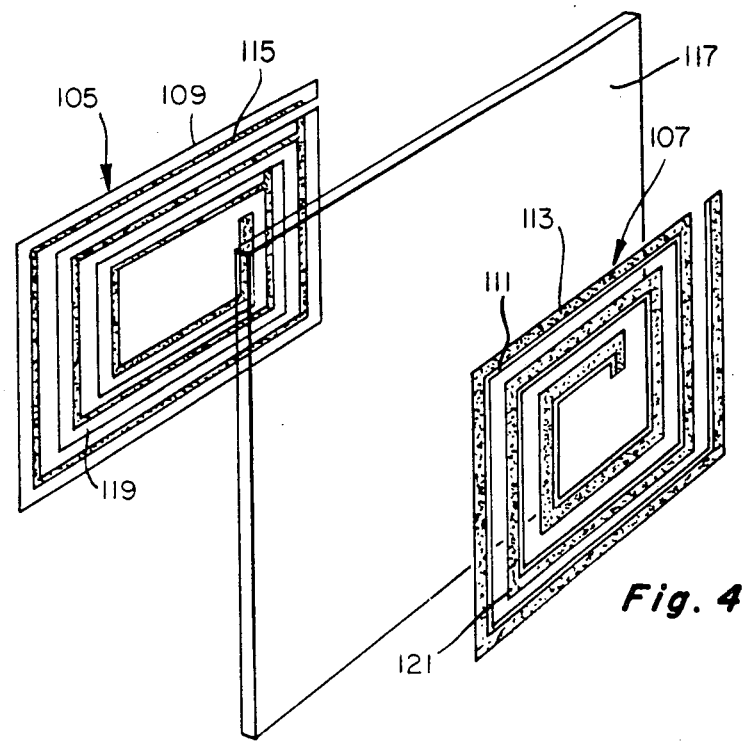
FIG. 4 shows a circuit with two opposing spiral conductive paths wherein there is full overlap for distributed capacitance which is produced by the process of this invention.

Referring to FIG. 4, an alternative embodiment is shown wherein there is partial overlap between two conductive paths 105 and 107 over the entire length of each circuit. As is the case in FIGS. 2 and 3, the light portions 109 and 111 of the respective spirals do not overlap each other while the dark portions 113 and 115 of each spiral overlap each other. Electrical connections between the two spirals can be made through substrate 117 at points 119 and 121.

Figure 5:
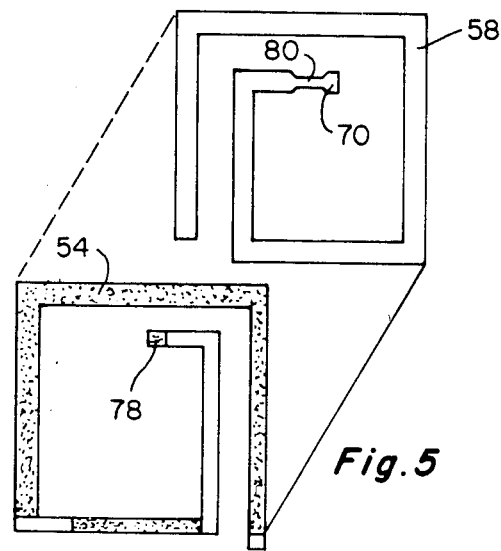
FIG. 5 is an exploded view of a resonant circuit produced by the process of this invention which includes a fusable link.

Referring to FIG. 5, conductive paths 54 and 58 are shown which are provided with fusible link 80. The conductive paths 54 and 58 are connected through an insulated substrate (not shown) at points 70 and 78. The fusable link 80 can be rendered inoperative by means of radio frequency energy or contact with a high voltage source to overload the circuit and cause the fusible link to short out and thus render the circuit inoperative.

While this invention has been described above with reference to resonant circuit tags, it is to be understood that the process of this invention is useful for forming metallic patterns, such as printed circuits or decorative patterns, of any configuration, on one or both sides of a polyolefin thin film substrate.

The following examples illustrate the present invention and are not intended to limit the same.

EXAMPLE I

A continuous strip of printed circuit patterns comprising a plurality of RF-tuned circuits was made by the following sequence of operations:

A roll of biaxially oriented polypropylene film, 1.25 mil thick by 8 inches wide, available from Mobil Chemical Corporation under their tradename of Bicor 240IG, is pretreated to render it susceptible to electroless metal deposition by the following sequence of chemical exposure steps. The film is drawn through a bath containing 3% turpentine in a water emulsion. The film is exposed to this plasticizing solvent for a period of 5 minutes at a temperature of 65°–70° C. and then rinsed well to remove any excess solvent prior to immersion in the second treatment bath which consists of 46° Baumé chromic/sulfuric acid at 75°–80° C. for a period of 5 minutes to effect surface etching of the film to enhance adhesion of the subsequent metal plated layer. After exposure in the heated bath of chromic/sulfuric acid, the film is again rinsed well on both sides prior to immersion in a preconditioning bath of Macuplex 9320 (available from MacDermid Incorporated, Waterbury, Conn.) for a period of 5 minutes which is at 50°–55° C. It is then rinsed and treated for 5 minutes at 20°–25° C. with a solution of Macuplex D-34 (available from MacDermid Incorporated, Waterbury, Conn.) catalyst which is a colloidal dispersion made from a combination of palladium and tin chlorides, in 20% hydrochloric acid, finally rinsed, dried and rewound in a roll.

Figure 6:
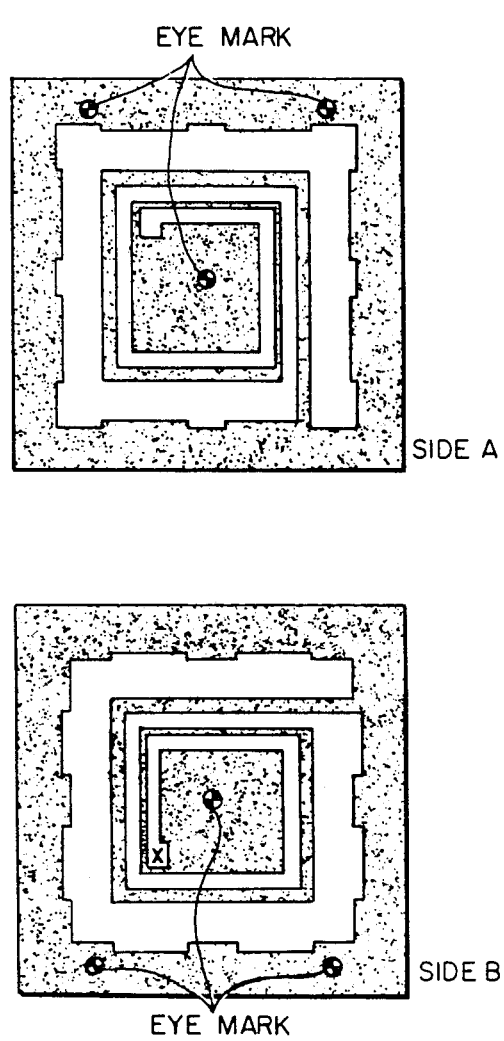
FIG. 6 shows the two circuit paths on opposing surfaces of an insulating layer with a through substrate connection produced in Example I.

The pretreated film is then printed with a plurality of circuit patterns by a high-speed flexographic press at about 100 feet per minute. The individual tag pattern is shown in FIG. 6 where the final tag pattern is formed by aligning side A with side B such that the "x" and eye marks are registered on opposing surfaces of the film. A flexographic ink, chosen to be resistant to the subsequent plating chemicals, serves as a plating mask to block off the non-circuit areas of the pretreated film. It is important to have close tolerance alignment (±20 mils) of the pattern from side-to-side in order that the overlapping patterns form a distributive capacitor element, with the least amount of variation in capacitance, as described in U.S. Pat. Appl. Ser. No. 565,350, filed Dec. 27, 1983. In addition, a through-hole connection to facilitate electrical continuity from side-to-side is provided by perforation consisting of a punched hole or a series of slits or holes which fall repetitively on the pattern in the exact area marked "x" in FIG. 6, sides A and B. Thus, subsequent plating through the slits or holes in the film provides for electrical continuity between the double sided circuit patterns.

After printing, the film is then prepared for electroless copper deposition in the non-printed areas, corresponding to the circuit pattern desired, by first passing the film through an accelerator bath consisting of Ultracel 9369 (available from MacDermid Incorporated, Waterbury, Conn.). The film is treated for 2–3 minutes at 20°–25° C. with the accelerator to remove tin from the catalytically treated surface. This acceleration exposes active palladium sites and prevents tin contamination in the electroless copper bath. The film is rinsed and then passed directly into an electroless copper bath, Macudep 70 (available from MacDermid Incorporated, Waterbury, Conn.), at 40° C. for a period of 10 minutes which deposits approximately 20–60 microinches of electroless copper. This is sufficient to render the surface conductive for subsequent electrolytic copper plating.

After electroless copper deposition, the film is then electroplated with copper. This can be accomplished in a typical vertical or horizontal reel-to-reel strip plating fashion where the film is passed through a series of electrolytic plating cells preferably with progressively increasing amperage which causes copper to deposit on the conductive surface and build to a sufficient thickness to achieve desired resistance levels in the circuit patterns. In the circuit patterns described in this example, copper was plated to a thickness of approximately 1 mil over a period of 40 minutes through a series of 10 electroplating cells, with progressively increasing current density. The first 25% of the plating cells contain a high copper, low acid bath as previously described and the remainder of the copper is plated with a standard bright acid copper bath (also described previously). The two bath system provides improved adhesion of the electrolytic copper plate. Typical copper to substrate adhesion of 2.0 to 2.2 lbs/inch can be obtained in this manner. Copper is deposited on the conductive surface and built to a sufficient thickness to achieve desired resistance levels in the circuit patterns. In the circuit patterns described in this example, the copper was of sufficient thickness on each discrete circuit pattern from side A to side B to provide a resistance value of 0.2 ohms. This provided individual RF-tuned circuits with this particular pattern that had a frequency response of 8.2 MHz and a Q value of 80. Each circuit has a dimension of 2 inches by 2 inches.

The roll of repeating circuit patterns is then subsequently laminated with a cover paper on one side and a pressure sensitive adhesive with a removable protective backing paper on the other side and slit and butt-cut to form suitable product for individual tag application as an adhesive sticker label. The tags are cut into individual strips and rolled for easy dispensing from applicator devices. When separated from each other, the individual radio frequency-tuned circuit patterns functioned efficiently in a typical RF detector system used for electronic surveillance detection systems.

When operating the process of this example as a roll-to-roll process wherein the thin polypropylene substrate is processed continuously through the treating steps prior to electroless plating or continuously through the electrolytic plating step, the substrate film is advanced at a rate between about 2 and 10 feet/minute. Within this process rate range, the desired surface treatment is effected without mechanically damaging the film.

EXAMPLE II

A continuous strip of printed circuit patterns comprising a plurality of RF tuned circuits was made by the following sequence of operations:

A roll of biaxially oriented polypropylene film, 1.25 mil thick by 16 inches wide, obtained from Mobil Chemical Corporation under their tradename of Bicor 240IG, was pretreated to render it susceptible to electroless metal plating by the following sequence of chemical exposure steps. The film was drawn through a bath containing 3% turpentine in a water emulsion. The film is exposed to the plasticizing solvent for a period of 5 minutes at a temperature of 65°–70° C. and then water rinsed to remove any excess solvent prior to immersion in the second treatment bath for 5 minutes which consists of 46° Baumé chromic/sulfuric acid at 80° C. to effect surface etching of the film to enhance adhesion of the subsequent metal plating layer. After exposure in the heated bath of chromic/sulfuric acid, the film is again water rinsed prior to immersion in a preconditioning bath of Macuplex 9320 which is at 50°–55° C. for a period of 5 minutes. It is then water rinsed and treated with a solution of Macuplex D-34 catalyst which is colloidally dispersed palladium made from a combination of palladium and tin chlorides in 20% hydrochloric acid, at 20°–25° C. for a period of 5 minutes, and then finally water rinsed, dried and rewound in a roll.

The film is prepared for electroless copper deposition by first passing the film through an accelerator bath, Shipley Accelerator 19 (available from Shipley Company, Inc., Newton, Mass.), which is a fluoroboric acid based solution, for 3–4 minutes at 20°–25° C., which strips the tin from the catalytically activated film surface, and exposes active palladium sites which initiate subsequent electroless copper deposition and prevents tin contamination in the electroless copper bath. The film is water rinsed and passed directly into an electroless copper bath, Hunt's Endura-plate EP-407 (available from Philip A. Hunt Corporation, Palisades Park, N.J.), at 20°–25° C. for a period of 10 minutes which deposits approximately 15–20 microinches of electroless copper on the film as a tightly adherent metal coating. This is sufficient to render the surface conductive for subsequent electrolytic copper plating.

Figure 7:
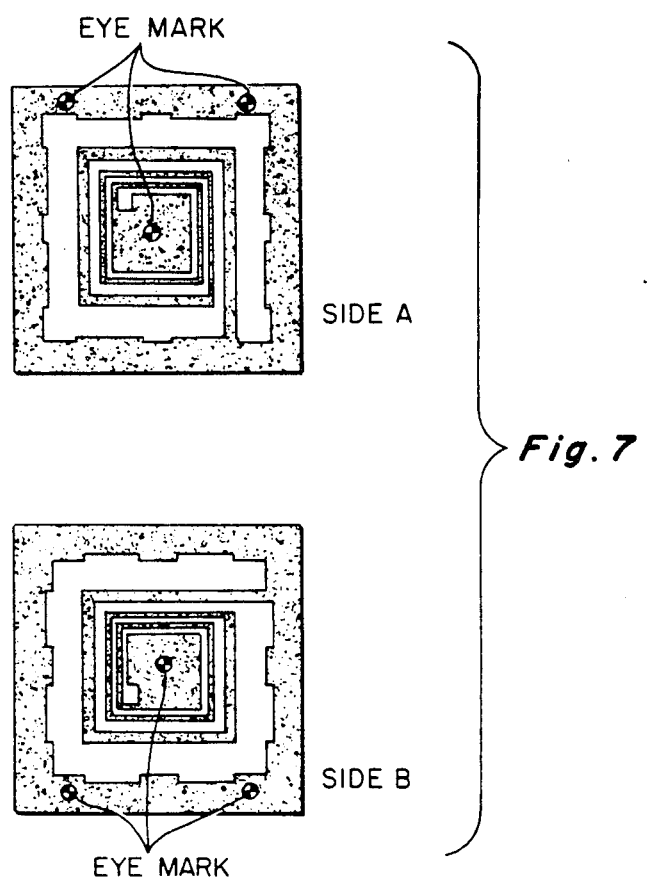
FIG. 7 shows the two circuit paths on opposing surfaces of an insulating layer produced in Example II.

The metalized film is then printed with a plurality of circuit patterns by a high-speed flexographic press at about 100 feet per minute. The individual tag pattern is shown in FIG. 7 where the final tag pattern is formed by aligning side A with side B such that the "x" and eye marks are registered on opposing surfaces of the film. Flexographic inks, chosen to be resistant to the subsequent plating chemicals, serve as a plating mask to block off the non-circuit areas of the pretreated film. It is important to have close tolerance alignment (±15 mils) of the pattern from side-to-side, in order that the overlapping patterns form a distributive capacitor element as described in U.S. Pat. Appl. Ser. No. 565,350, filed Dec. 27, 1983. The through-hole perforation on each tag is done at the same time as the printing at the exact area marked "x" in FIG. 7, side A and side B.

After printing, the film is further electroplated with copper. This can be accomplished in a typical vertical or horizontal reel-to-reel strip plating fashion where the film is passed through a series of electrolytic plating cells with constant voltage (progressively increasing amperage) causing copper to deposit on the conductive surface and build to a sufficient thickness to achieve desired resistance levels in the circuit patterns. In the circuit patterns described in this example, copper was plated to a thickness of approximately 1.0 mil over a period of 40 minutes through a series of 10 progressive electroplating cells with the bright acid copper bath described previously.

Following plating, the printed ink is stripped off in a 5 vol% butylcellosolve, 5 wt% sodium hydroxide aqueous solution at 45°–50° C. for 5 minutes in a continuous spray resist stripper. The film is rinsed and the thin electroless copper layer is etched from the non-circuit areas, previously protected by the ink, by an aqueous $CuCl_2$ solution at 45°–50° C. for 5 minutes in a continuous process.

In the circuit patterns described in this example, the copper was of sufficient thickness on each discrete circuit pattern from side A to side B to provide a resistance value of 0.2 ohms. Each individual circuit pattern has a dimension of 1.5 inches by 1.4 inches. This process provided individual RF-tuned circuits with this particular pattern that had a frequency response of 8.2 MHz and a Q value of 60.

The roll of repeating circuit tag patterns are then subsequently laminated with a cover paper on one side and a pressure sensitive adhesive with a removable protective backing paper on the other side; and slit and cut to form suitable product for individual tag application as an adhesive sticker label. The tags are cut into individual strips and rolled for easy dispensing from applicator devices. When separated from each other, the individual radio frequency-tuned circuit patterns function efficiently in a typical RF detector system used for electronic surveillance detection systems.

When operating the process of this example as a roll-to-roll process wherein the thin polypropylene substrate is processed continuously through the treating steps prior to electroless plating or continuously through the electrolytic plating step, the substrate film is advanced at a rate between about 2 and 10 feet/minute. Within this process rate range, the desired surface treatment is effected without mechanically damaging the film.

EXAMPLE III

A continuous strip of printed circuit patterns comprising a plurality of RF-tuned circuits were made by the following sequence of operations:

A roll of biaxially oriented polypropylene film, 1.25 mil thick by 16 inches wide, available from Mobil Chemical Corporation under their tradename of Bicor 240IG, is pretreated to render it susceptible to electroless plating by the following sequence of chemical exposure steps. The film is drawn through a bath containing 3% turpentine in a water emulsion. The film is exposed to the plasticizing solvent for a period of 5 minutes at a temperature of 65°–70° C. and then water rinsed to remove any excess solvent prior to immersion in the second treatment bath for 5 minutes which consists of 46° Baumé chromic/sulfuric acid at 175° F. to effect surface etching of the film to enhance adhesion of the subsequent metal plating layer. After exposure in the heated bath of chromic/sulfuric acid, the film is again water rinsed prior to immersion in a preconditioning bath of Macuplex 9320 which is at 50°–55° C. for a period of 5 minutes. It is then rinsed and treated with a solution of Macuplex D-34 catalyst which is a colloidally dispersed palladium made from a combination of palladium and tin chlorides in 20% hydrochloric acid, at 20°–25° C. for a period of 5 minutes, and then finally rinsed, dried and rewound in a roll.

Figure 8:
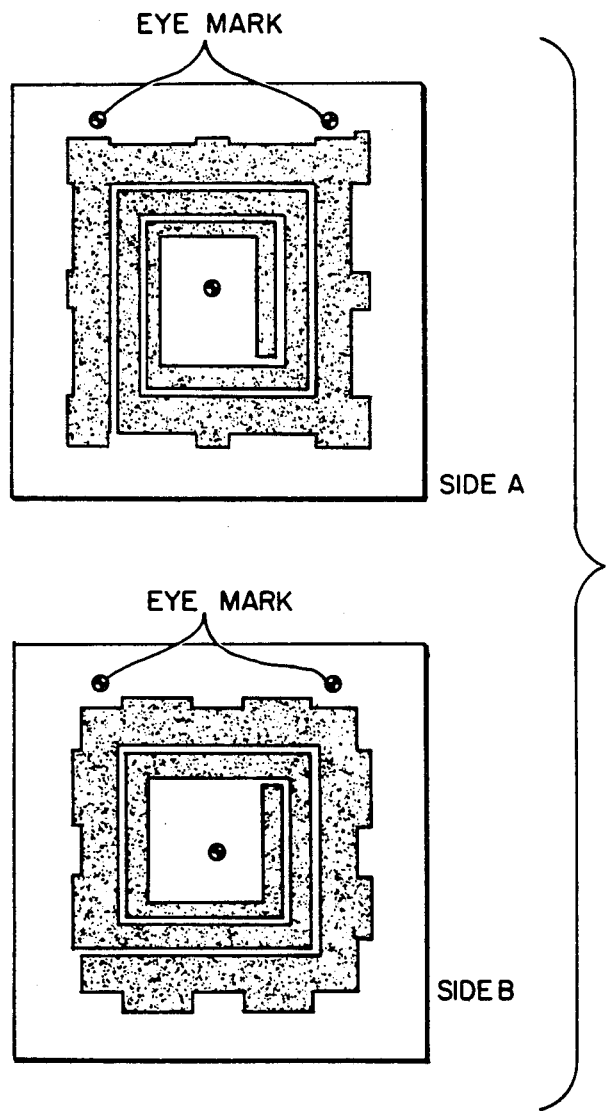
FIG. 8 shows the two circuit paths on opposing surfaces of an insulating layer produced in Example III.

The film is prepared for electroless copper deposition by first passing the film through an accelerator bath, Shipley Accelerator 19, a fluoroboric acid solution, for 3-4 minutes at 20°–25° C. which strips the tin from the catalytically activated film surface and exposes active palladium sites which initiate subsequent electroless copper deposition. The film is rinsed and then passed directly into an electroless copper bath, Hunt's Enduraplate EP 407, at 25° C. for a period of 10 minutes which deposits approximately 15–20 microinches of electroless copper. This is sufficient to render the surface conductive for subsequent electrolytic copper plating. The film is then given a flash electroplate coating from an electroforming type bath (described previously) to a thickness of 70–80 microinches. The metallized film is then printed with the positive image in a plurality of circuit patterns by a high-speed flexographic press at about 100 feet per minute. The individual tag pattern is shown in FIG. 8 where the final tag pattern is formed by aligning side A with side B such that the "x" and eye marks are registered on opposing surfaces of the film. Flexographic inks, chosen to be resistant to the subsequent etching chemical, serve as a plating mask to block off the non-circuit areas of the pretreated film. It is important to have close tolerance alignment (±15 mils) of the pattern from side-to-side in order that the overlapping patterns form a distributive capacitor element with the least amount of variation in capacitance, as described in copending U.S. patent appl. Ser. No. 565,530, filed Dec. 27, 1983. In addition, a through-hole connection to facilitate electrical continuity from side-to-side is provided by perforation consisting of a punched hole or a series of slits or holes which fall repetitively on the pattern in the exact area marked "x" in FIG. 8, side A and side B. Thus, subsequent plating through the slits or holes in the film provides for electrical continuity between the double-sided circuit patterns.

After printing, the non-circuit areas are removed by etching in an aqueous $CuCl_2$ solution at 45°–50° C. for 5 minutes in a continuous process. The film is rinsed, and the ink stripped off in a 5 vol% butylcellosolve, 5 wt% sodium hydroxide aqueous solution at 45°–50° C. for 5 minutes using a continuous spray etcher.

After printing, etching and stripping, the film is electroplated with copper. This can be accomplished in a typical vertical or horizontal reel-to-reel strip plating fashion where the film is passed through a series of electrolytic plating cells with increasing amperage causing copper to deposit on the conductive surface and build to a sufficient thickness to achieve desired resistance levels in the circuit patterns. In the circuit patterns described in this example, copper was plated to a thickness of approximately 1 mil over a period of 40 minutes through a series of 10 progressive electroplating cells. In the circuit patterns described in this example, the copper was of sufficient thickness on each discrete circuit pattern from side 1 to side 2 to provide a resistance value of 0.2 ohms. This provided individual RF-tuned circuits with this particular pattern that had a frequency response of 8.2 MHz and a Q value of 70. Each circuit has a dimension of 2 inches by 2 inches.

The roll of repeating circuit tag patterns are then subsequently laminated with a cover paper on one side and a pressure sensitive adhesive with a removable protective backing paper on the other side; and slit and cut to form suitable product for individual tag application as an adhesive sticker label. The tags are cut into individual strips and rolled for easy dispensing from applicator devices. When separated from each other, the individual radio frequency-tuned circuit patterns function efficiently in a typical RF detector system used for electronic surveillance detection systems.

When operating the process of this example as a roll-to-roll process wherein the thin polypropylene substrate is processed continuously through the treating steps prior to electroless plating and continuously through the electrolytic plating step, the substrate film is advanced at a rate between about 2 and 10 feet/minute. Within this process rate range, the desired surface treatment is effected without mechanically damaging the film.

EXAMPLE IV

A continuous strip of printed circuit patterns comprising a plurality of RF tuned circuits was made by the exact sequence described in Example II with the addition of printing a non-strippable ink over the conductive circuit wind as shown in FIG. 9. This non-strippable ink, strip 90, was printed at the same time as the strippable ink and was printed over a thin layer of electroless copper. During subsequent plating steps, the copper under this ink does not plate, leaving a thin copper layer in the final plated circuit pattern. In the stripping operation, this non-strippable ink will not be removed, thus protecting the copper from being etched away in the copper etching solution. This thin copper layer, in the final tuned circuit, will function as a fuse which can render the tag inoperative by means of radio frequency energy or contact with a high voltage source.

I claim:

1. A process for forming a conductive circuit on a thin polyolefin film substrate which comprises passing said polyolefin film sequentially through:
   (a) a liquid plasticizing bath adapted to effect plasticizing or softening of said film,
   (b) a liquid etching bath adapted to provide attraction sites for subsequent catalytic metal deposition and to produce microvoids for increased adhesion for a subsequently applied metal layer,
   (c) a liquid conditioning bath adapted to improve adsorption of the subsequently applied metal catalyst,
   (d) a liquid catalyst bath to effect deposition of a catalytic metal layer on said substrate,
   (e) a printing step to print a negative image of the circuit on the film surface,
   (f) a liquid accelerator bath, to convert the catalytic metal layer to an active state to effect subsequent electroless plating of metal,
   (g) an electroless metal deposition bath, thereby to electrolessly deposit metal on the non-printed portion of said film, and
   (h) at least one electrolytic plating cell in order to increase the metal thickness to the desired level for optimum functionality of the finished circuit;
   said steps (a), (b), (c), (d), (e), (f), (g), and (h) being conducted so as to retain mechanical integrity of said substrate.

2. A process for forming a conductive circuit on a thin polyolefin film substrate which comprises passing said polyolefin film substrate sequentially through:
   (a) a liquid plasticizing bath adapted to effect plasticizing or softening of said film,
   (b) a liquid etching bath adapted to provide attraction sites for subsequent catalytic metal deposition and to produce microvoids for increased adhesion of a subsequently applied metal layer,
   (c) a liquid conditioning bath adapted to improve adsorption of subsequently applied metal catalyst,
   (d) a liquid catalyst bath to effect deposition of a catalytic metal layer on said film,
   (e) a liquid accelerator bath adapted to convert the catalytic metal layer to an active state to effect subsequent electroless plating of metal,
   (f) an electroless metal deposition bath, thereby to electrolessly deposit metal on the film surface,
   (g) a printing step to print a negative image of the circuit on said metal plated film,
   (h) at least one electrolytic plating cell to selectively increase metal thickness on exposed electrolessly deposited metal,
   (i) a stripping bath to remove the printed ink and expose the electroless copper underneath said printed ink, and,
   (j) a second stripping bath to etch off the electroless metal deposit not coated with electrolytically deposited metal and thus isolate the conductive circuit patterns in the desired plated area;
   said steps (a), (b), (c), (d), (e), (f), (g), (h), (i), and (j) being conducted to retain mechanical integrity of said film.

3. The process of claim 2 wherein the film from step (f) is electrolytically plated on the electrolessly deposited metal prior to said printing step (g) and step (j) is conducted to remove from said film said thin film of electrolytically applied metal which has not been further plated with metal and to remove from said film electrolessly applied metal located underneath said thin film of electrolytically applied metal.

4. A process for forming a conductive circuit on a thin polyolefin film substrate, which comprises passing said polyolefin film substrate sequentially through:
   (a) a liquid plasticizing bath adapted to effect plasticizing or softening of said film,
   (b) a liquid etching bath adapted to provide attraction sites for subsequent catalytic metal deposition and to produce microvoids, for increased adhesion for a subsequently applied metal layer,
   (c) a liquid conditioning bath adapted to improve adsorption of subsequently applied metal catalyst,
   (d) a liquid catalyst bath to effect deposition of a catalytic metal layer on said film,
   (e) a liquid accelerator bath adapted to convert the catalytic metal layer to an active state to effect subsequent electroless plating of metal,
   (f) an electroless metal deposition bath thereby to electrolessly deposit metal on the film surface,
   (g) a printing step to print a positive image of the circuit on said film,
   (h) an etching solution to remove exposed electroless metal deposit from said film,
   (i) a solvent stripping bath to remove said printed positive image ink from said film, and,
   (j) at least one electrolytic plating cell to selectively increase metal thickness on exposed electrolessly deposited metal;
   said steps (a), (b), (c), (d), (e), (f), (g), (h), (i), and (j) all being conducted so as to retain the mechanical integrity of the substrate.

5. The process of claim 4 wherein the film from step (f) is treated to coat the electrolessly deposited layer with a thin film of electrolytically applied metal prior to said printing step (g) and step (h) is conducted to remove from said film said thin film of electrolytically applied metal which has not been further coated with metal and to remove from said film electrolessly applied metal located underneath said thin film of electrolytically applied metal.

6. The process of any one of claims 1, 2, 3, 4, or 5 wherein said polyolefin film is polyethylene film.

7. The process of any one of claims 1, 2, 3, 4 or 5 wherein said polyolefin film is polypropylene film.

8. The process of any one of claims 1, 2, 3, 4, or 5 wherein the deposited metal is copper.

9. The process of any one of claims 1, 2, 3, 4, or 5 wherein the polyolefin film is polyethylene film and the deposited metal is copper.

10. The process of any one of claims 1, 2, 3, 4, or 5 wherein the polyolefin film is polypropylene film and the deposited metal is copper.

11. A process for forming a plurality of resonant tag circuits on a thin polyolefin film substrate, each of said resonant tag circuits including a first spiral conductive path on a first surface of said substrate and second spiral conductive path on a second surface of said substrate, said spiral conductive paths forming inductors for each of said circuits and being aligned to overlap with each other to form the desired capacitance for each of said circuits which comprises passing said polyolefin film substrate sequentially through:
  (a) a liquid plasticizing bath adapted to effect plasticizing or softening of said film substrate,
  (b) a liquid etching bath adapted to provide attraction sites for subsequent catalytic metal deposition and to produce microvoids for increased adhesion for the subsequently applied metal layer,
  (c) a liquid conditioning bath adapted to improve adsorption of the subsequently applied metal catalyst,
  (d) a liquid catalyst bath to effect deposition of a catalytic metal layer on said substrate,
  (e) a printing step to print a negative image of the resonant tag circuits on each of said substrate surfaces in appropriate alignment from side-to-side,
  (f) a liquid accelerator bath to convert the catalytic metal layer to an active state to effect subsequent electroless deposition of metal,
  (g) an electroless metal deposition bath, thereby to electrolessly deposit metal on the non-printed portion of said film, and,
  (h) at least one electrolytic plating cell in order to increase the metal thickness to the desired level for optimum functionality of the finished resonant circuit;
  said steps (a), (b), (c), (d), (e), (f), (g), and (h) being conducted so as to retain the mechanical integrity of said substrate.

12. The process of claim 11 wherein the film has been plated in step (g) and a small section of the circuit trace is printed with a plating resist such that the metal under this resist will not plate in subsequent plating steps resulting in a thin conductive layer forming a segment of the circuit pattern that can function as a fuse which can be rendered inoperative by means of radio frequency energy or contact with a high voltage source to overload the circuit and cause the fusible link to short and thus render the circuit inoperative.

13. The process of claims 11 or 12 wherein the film from step (d) is perforated while printing in step (e) to make at least one hole or slit in the film in an area to be plated for forming at least one through substrate electrical connection for connecting circuit traces on opposite sides of the substrate.

14. A process for forming a plurality of resonant tag circuits on a roll of a thin polyolefin film substrate, each of said resonant tag circuits including a first spiral conductive path on a first surface of said substrate and second spiral conductive path on a second surface of said substrate, said spiral conductive paths forming inductors for each of said circuits and being aligned to overlap with each other to form the desired capacitance for each of said circuits which comprises passing said thin film substrate sequentially through:
  (a) a liquid plasticizing bath adapted to effect plasticizing or softening of said film substrate.
  (b) a liquid etching bath adapted to provide attraction sites for subsequent catalytic metal deposition and to produce microvoids for increased adhesion of a subsequently applied metal layer,
  (c) a liquid conditioning bath adapted to improve adsorption of subsequently applied metal catalyst,
  (d) a liquid catalyst bath to effect deposition of a catalytic metal layer on said substrate,
  (e) a liquid accelerator bath adapted to convert the deposited catalytic metal layer to an active state to effect subsequent electroless plating of metal,
  (f) an electroless metal deposition bath thereby to electrolessly deposit metal on the film surface,
  (g) a printing step to print a negative image resonant tag circuit on each of said substrate surfaces with appropriate pattern alignment and through-hole perforation,
  (h) at least one electrolytic plating cell to selectively increase metal thickness on exposed electrolessly deposited metal,
  (i) a solvent stripping bath to remove the printed ink and expose the electroless copper underneath said printed ink, and,
  (j) an etching bath to selectively etch off the electroless metal deposit not coated with electrolytically deposited metal and thus isolate the conductive circuit patterns in the desired plated area;
  said steps (a), (b), (c), (d), (e), (f), (g), (h), (i), and (j) being conducted so as to retain the mechanical integrity of said substrate.

15. The process of claim 14 wherein the film to be printed in step (g) is printed with a strippable ink, which is removed in the stripping bath in step (i), and is printed with a non-strippable ink, which cannot be removed in the stripping bath in step (i) were the metal layer under said non-strippable ink is not removed in the second stripping bath (j) and results in a thin conductive layer forming a segment of the circuit pattern that functions as a fuse.

16. The process of claims 14 or 15 wherein the film from step (f) is perforated while printing in step (g) to make at least one hole or slit in the film in an area to be printed for forming at least one through substrate electrical connection for connecting circuit traces on opposite sides of the substrate.

17. The process of claims 14 or 15 wherein the film from step (f) is treated to coat the electrolessly deposited layer with a thin film of electrolytically applied metal prior to said printing step (g) and step (j) is conducted to remove from said film said thin film of electrolytically applied metal which has not been further coated with metal and to remove from said film electrolessly applied metal located underneath said thin film of electrolytically applied metal.

18. The process of any one of claims 11, 12, 14, or 15 wherein said polyolefin film is polyethylene film.

19. The process of any one of claims 11, 12, 14, or 15 wherein said polyolefin film is polypropylene film.

20. The process of any one of claims 11, 12, 14, or 15 wherein said deposited metal is copper.

21. The process of any one of claims 11, 12, 14, or 15 wherein said polyolefin film is polyethylene film and the deposited metal is copper.

22. The process of any one of claims 11, 12, 14, or 15 wherein said polyolefin film is polypropylene film and the deposited metal is copper.

23. The process of claim 17 wherein the film to be printed in step (g) is printed with a strippable ink which is removed in the stripping bath in step (i), and a non-strippable ink, which cannot be removed in the stripping bath in step (i) where the metal layer under said non-strippable ink is not plateable, resulting in a thin conductive layer forming a segment of the circuit pattern that can function as a fuse which can be rendered inoperative by means of radio frequency energy or contact with a high voltage source to overload the circuit and cause the fusible link to short and thus render the circuit inoperative.

24. A process for forming a plurality of resonant tag circuits on a thin polyolefin film substrate, each of said resonant tag circuits including a first spiral conductive path on a first surface of said substrate and a second spiral conductive path on a second surface of said substrate, said spiral conductive paths forming inductors for each of said circuits and being aligned to overlap with each other to form the desired capacitance for each of said circuits which comprise passing said thin film substrate sequentially through:

(a) a liquid plasticizing bath adapted to effect plasticizing or softening of said film, (b) a liquid etching bath adapted to provide attraction sites for subsequent catalytic metal deposition and to produce microvoids for increased adhesion for a subsequently applied metal layer, (c) a liquid conditioning bath adapted to improve adsorption of subsequently applied metal catalyst, (d) a liquid catalyst bath to effect deposition of a catalytic metal layer on said film, (e) a liquid accelerator bath adapted to convert the deposited catalytic metal layer to an active state to effect subsequent electroless plating of metal, (f) passing the substrate from step (e) through an electroless metal deposition bath thereby to electrolessly deposit metal on the film surface, (g) a printing step to print a positive image of the resonant tag circuits on each of said film surfaces, (h) an etching solution to remove exposed electroless metal deposit from said film, (i) a solvent stripping bath to remove said printed positive image ink from said film, and (j) at least one electrolytic plating cell to selectively increase metal thickness on exposed electrolessly deposited metal;

said steps (a), (b), (c), (d), (e), (f), (g), (h), (i), and (j) all being conducted so as to retain the mechanical integrity of the substrate.

25. The process of claim 24 wherein the film from step (d) is perforated while printing in step (e) to make at least one hole or slit in the film in an area to be plated for forming at least one through substrate electrical connection for connecting circuit traces on opposite sides of the substrate.

26. The process of claim 24, or 23 wherein the film from step (f) is treated to coat the electrolessly deposited layer with a thin film of electrolytically applied metal prior to said printing step (g) and step (h) is conducted to remove from said film said thin film of electrolytically applied metal which has not been further coated with metal and to remove from said film electrolessly appled metal located underneath said thin film of electrolytically applied metal.

* * * * *